United States Patent
Dudzinski et al.

(10) Patent No.: US 10,834,614 B2
(45) Date of Patent: Nov. 10, 2020

(54) QUALITY OF SERVICE IN WIRELESS BACKHAULS

(71) Applicant: Airspan Networks Inc., Boca Raton, FL (US)

(72) Inventors: Krzysztof Dudzinski, Slough (GB); Kevin Andrew Terry, Paignton (GB)

(73) Assignee: Airspan Networks Inc., Boca Raton, FL (US)

(*) Notice: Subject to any disclaimer, the term of this patent is extended or adjusted under 35 U.S.C. 154(b) by 639 days.

(21) Appl. No.: 15/187,570

(22) Filed: Jun. 20, 2016

(65) Prior Publication Data
US 2016/0381585 A1 Dec. 29, 2016

(30) Foreign Application Priority Data

Jun. 25, 2015 (GB) .................................. 1511200.6
Oct. 30, 2015 (GB) .................................. 1519216.4

(51) Int. Cl.
*H04W 24/02* (2009.01)
*H04W 4/50* (2018.01)
(Continued)

(52) U.S. Cl.
CPC ............ *H04W 24/02* (2013.01); *F16M 11/06* (2013.01); *G01S 3/043* (2013.01); *G01S 3/14* (2013.01);
(Continued)

(58) Field of Classification Search
CPC ....... H04W 24/02; H04W 4/50; H04W 28/24; H04W 16/28; H04W 48/06; H04W 4/001;
(Continued)

(56) References Cited

U.S. PATENT DOCUMENTS 4,599,620 A 7/1986 Evans
4,633,256 A 12/1986 Chadwick
(Continued)

FOREIGN PATENT DOCUMENTS

CN 1284794 A 2/2001
CN 104635203 A 5/2015
(Continued)

OTHER PUBLICATIONS

Doi et al., "Low-Cost Antenna Array Via Antenna Switching for High Resolution 2-D DOA Estimation," SIPS 2013 Proc. IEEE, Oct. 16, 2013, pp. 83-88.
(Continued)

*Primary Examiner* — Walter J Divito
(74) *Attorney, Agent, or Firm* — Haynes Beffel & Wolfeld LLP; Mark A. Haynes; Andrew L. Dunlap

(57) ABSTRACT

A feeder terminal comprises backhaul communication circuitry connecting a communications network via a wireless backhaul, and providing an access base station with wireless backhaul access. Backhaul information circuitry determines congestion information relating to the wireless backhaul and communication circuitry enables communication with an access base station and provides the congestion information to the access base station. In response to a demand message from the access base station comprising quality of service requirements, the communication circuitry forwards the demand message to the communications network. Additionally, an access base station comprises communication circuitry enabling communication with a feeder terminal. The communication circuitry provides a quality of service demand message to the feeder terminal based on a quality of service requirement and receives congestion information relating to the wireless backhaul from the feeder terminal. The access control circuitry controls usage of the wireless
(Continued)

backhaul by user equipment in dependence on the congestion information.

20 Claims, 8 Drawing Sheets

(51) Int. Cl.

| | |
|---|---|
| H04B 7/06 | (2006.01) |
| H04B 7/08 | (2006.01) |
| F16M 11/06 | (2006.01) |
| G01S 3/04 | (2006.01) |
| G01S 3/14 | (2006.01) |
| G01S 5/02 | (2010.01) |
| G01S 19/24 | (2010.01) |
| G01S 19/53 | (2010.01) |
| H01Q 1/02 | (2006.01) |
| H01Q 1/12 | (2006.01) |
| H01Q 1/24 | (2006.01) |
| H01Q 1/36 | (2006.01) |
| H01Q 1/42 | (2006.01) |
| H01Q 1/50 | (2006.01) |
| H01Q 3/02 | (2006.01) |
| H01Q 3/04 | (2006.01) |
| H01Q 3/10 | (2006.01) |
| H01Q 3/12 | (2006.01) |
| H01Q 3/24 | (2006.01) |
| H01Q 3/26 | (2006.01) |
| H01Q 3/36 | (2006.01) |
| H01Q 21/00 | (2006.01) |
| H01Q 21/06 | (2006.01) |
| H01Q 21/08 | (2006.01) |
| H01Q 21/20 | (2006.01) |
| H01Q 21/24 | (2006.01) |
| H01Q 21/28 | (2006.01) |
| H01Q 25/00 | (2006.01) |
| H04B 7/0456 | (2017.01) |
| H04L 12/24 | (2006.01) |
| H04L 12/26 | (2006.01) |
| H04L 29/08 | (2006.01) |
| H04W 16/28 | (2009.01) |
| H04W 24/08 | (2009.01) |
| H04W 24/10 | (2009.01) |
| H04W 28/02 | (2009.01) |
| H04W 28/24 | (2009.01) |
| H04W 40/22 | (2009.01) |
| H04W 48/06 | (2009.01) |
| H04W 72/04 | (2009.01) |
| H04W 72/08 | (2009.01) |
| H04W 88/04 | (2009.01) |
| H05K 7/20 | (2006.01) |
| H04W 84/02 | (2009.01) |
| H04W 84/04 | (2009.01) |
| H04W 88/08 | (2009.01) |

(52) U.S. Cl.
CPC ............ *G01S 5/0247* (2013.01); *G01S 19/24* (2013.01); *G01S 19/53* (2013.01); *H01Q 1/02* (2013.01); *H01Q 1/1207* (2013.01); *H01Q 1/1228* (2013.01); *H01Q 1/246* (2013.01); *H01Q 1/36* (2013.01); *H01Q 1/42* (2013.01); *H01Q 1/50* (2013.01); *H01Q 3/02* (2013.01); *H01Q 3/04* (2013.01); *H01Q 3/10* (2013.01); *H01Q 3/12* (2013.01); *H01Q 3/24* (2013.01); *H01Q 3/26* (2013.01); *H01Q 3/2611* (2013.01); *H01Q 3/36* (2013.01); *H01Q 21/00* (2013.01); *H01Q 21/065* (2013.01); *H01Q 21/08* (2013.01); *H01Q 21/205* (2013.01); *H01Q 21/24* (2013.01); *H01Q 21/28* (2013.01); *H01Q 25/002* (2013.01); *H01Q 25/005* (2013.01); *H04B 7/0456* (2013.01); *H04B 7/0617* (2013.01); *H04B 7/0621* (2013.01); *H04B 7/0691* (2013.01); *H04B 7/0695* (2013.01); *H04B 7/086* (2013.01); *H04B 7/088* (2013.01); *H04B 7/0874* (2013.01); *H04L 41/0806* (2013.01); *H04L 41/0816* (2013.01); *H04L 43/0829* (2013.01); *H04L 67/18* (2013.01); *H04L 67/34* (2013.01); *H04W 4/50* (2018.02); *H04W 16/28* (2013.01); *H04W 24/08* (2013.01); *H04W 24/10* (2013.01); *H04W 28/0236* (2013.01); *H04W 28/0268* (2013.01); *H04W 28/0284* (2013.01); *H04W 28/24* (2013.01); *H04W 40/22* (2013.01); *H04W 48/06* (2013.01); *H04W 72/042* (2013.01); *H04W 72/085* (2013.01); *H04W 88/04* (2013.01); *H05K 7/20* (2013.01); *H04B 7/0817* (2013.01); *H04W 84/02* (2013.01); *H04W 84/045* (2013.01); *H04W 88/08* (2013.01)

(58) Field of Classification Search
CPC . H04W 72/085; H04W 72/042; H04W 24/10; H04W 24/08; H04W 28/0284; H04W 40/22; H04W 28/0236; H04W 28/0268; H04W 88/04; H04W 84/045; H04W 84/02; H04W 88/08; H04B 7/086; H04B 7/0695; H04B 7/088; H04B 7/0874; H04B 7/0621; H04B 7/0617; H04B 7/0456; H04B 7/0691; H04B 7/0817; H04L 41/0806; H04L 41/0816; H04L 67/34; H04L 43/0829; H04L 67/18; F16M 11/06; H01Q 3/2611; H01Q 3/04; H01Q 1/42; H01Q 25/002; H01Q 1/1207; H01Q 3/26; H01Q 21/205; H01Q 3/02; H01Q 21/065; H01Q 21/24; H01Q 21/08; H01Q 1/50; H01Q 21/28; H01Q 25/005; H01Q 3/12; H01Q 3/36; H01Q 1/36; H01Q 1/1228; H01Q 21/00; H01Q 3/10; H01Q 1/246; H01Q 1/02; H01Q 3/24; G01S 3/14; G01S 3/043; G01S 19/24; G01S 5/0247; G01S 19/53; H05K 7/20
See application file for complete search history.

(56) References Cited

U.S. PATENT DOCUMENTS

| | | |
|---|---|---|
| 4,959,653 A | 9/1990 | Ganz |
| 5,125,008 A | 6/1992 | Trawick et al. |
| 6,124,832 A | 9/2000 | Jeon et al. |
| 6,404,385 B1 | 6/2002 | Croq et al. |
| 6,448,930 B1 | 9/2002 | Judd |
| 6,486,832 B1 | 11/2002 | Abramov et al. |
| 6,522,898 B1 | 2/2003 | Kohno et al. |
| 6,621,454 B1 | 9/2003 | Reudink et al. |
| 6,784,830 B1 | 8/2004 | Lawrence et al. |
| 6,934,511 B1 | 8/2005 | Lovinggood et al. |
| 6,963,747 B1 | 11/2005 | Elliott |
| 7,062,294 B1 | 6/2006 | Rogard et al. |
| 7,403,748 B1 | 7/2008 | Keskitalo et al. |
| 7,515,916 B1 | 4/2009 | Alexander |
| 7,593,693 B1 | 9/2009 | Kasapi et al. |
| 7,664,534 B1 | 2/2010 | Johnson |
| 7,697,626 B2 | 4/2010 | Wang et al. |
| 8,340,580 B1 | 12/2012 | Epstein |
| 8,509,724 B2 | 8/2013 | D'Amico et al. |

(56) References Cited

U.S. PATENT DOCUMENTS

| | | | |
|---|---|---|---|
| 8,577,416 B2 | 11/2013 | Nandagopalan et al. | |
| 8,630,267 B1 | 1/2014 | Jin | |
| 9,173,064 B1 | 10/2015 | Spain, Jr. | |
| 9,179,360 B1* | 11/2015 | Vivanco | H04L 1/1825 |
| 9,692,124 B2 | 6/2017 | Caimi et al. | |
| 9,698,891 B2 | 7/2017 | Larsson | |
| 9,706,419 B2 | 7/2017 | Bozier et al. | |
| 9,924,385 B2 | 3/2018 | Lysejko et al. | |
| 9,973,943 B2 | 5/2018 | Lysejko et al. | |
| 10,098,018 B2 | 10/2018 | Lysejko et al. | |
| 2002/0042274 A1 | 4/2002 | Ades | |
| 2002/0142779 A1 | 10/2002 | Goto et al. | |
| 2002/0159409 A1* | 10/2002 | Wolfe | H04W 92/20 370/329 |
| 2003/0195017 A1 | 10/2003 | Chen et al. | |
| 2003/0228857 A1 | 12/2003 | Maeki | |
| 2004/0043745 A1 | 3/2004 | Najarian et al. | |
| 2004/0077354 A1 | 4/2004 | Jason et al. | |
| 2004/0106436 A1 | 6/2004 | Ochi et al. | |
| 2004/0204850 A1 | 10/2004 | MacNeille et al. | |
| 2004/0233103 A1 | 11/2004 | Toshev | |
| 2004/0242274 A1 | 12/2004 | Corbett et al. | |
| 2005/0048921 A1 | 3/2005 | Chung | |
| 2005/0063340 A1 | 3/2005 | Hoffmann et al. | |
| 2005/0157684 A1 | 7/2005 | Ylitalo et al. | |
| 2005/0192037 A1 | 9/2005 | Nanda et al. | |
| 2005/0285784 A1 | 12/2005 | Chiang et al. | |
| 2006/0072518 A1 | 4/2006 | Pan et al. | |
| 2006/0292991 A1 | 12/2006 | Abramov et al. | |
| 2008/0005121 A1 | 1/2008 | Lam et al. | |
| 2008/0123589 A1 | 5/2008 | Lee et al. | |
| 2008/0287068 A1* | 11/2008 | Etemad | H04L 5/0007 455/68 |
| 2009/0005121 A1 | 1/2009 | Wong et al. | |
| 2009/0046638 A1 | 2/2009 | Rappaport et al. | |
| 2009/0067333 A1 | 3/2009 | Ergen et al. | |
| 2009/0086864 A1 | 4/2009 | Komninakis et al. | |
| 2009/0103492 A1 | 4/2009 | Altshuller et al. | |
| 2009/0116444 A1 | 5/2009 | Wang et al. | |
| 2009/0207077 A1 | 8/2009 | Hwang et al. | |
| 2009/0252088 A1 | 10/2009 | Rao et al. | |
| 2009/0274076 A1 | 11/2009 | Muharemovic et al. | |
| 2009/0310554 A1 | 12/2009 | Sun et al. | |
| 2010/0071049 A1 | 3/2010 | Bahr et al. | |
| 2010/0130150 A1 | 5/2010 | D'Amico et al. | |
| 2010/0216477 A1 | 8/2010 | Ryan | |
| 2010/0240380 A1 | 9/2010 | Yim et al. | |
| 2011/0003554 A1 | 1/2011 | Sekiya | |
| 2011/0163905 A1 | 7/2011 | Denis et al. | |
| 2011/0235569 A1* | 9/2011 | Huang | H04W 28/02 370/315 |
| 2011/0244808 A1 | 10/2011 | Shiotsuki et al. | |
| 2011/0312269 A1 | 12/2011 | Judd et al. | |
| 2012/0002598 A1 | 1/2012 | Seo et al. | |
| 2012/0015659 A1* | 1/2012 | Kalyani | H04W 72/085 455/436 |
| 2012/0046026 A1 | 2/2012 | Chande et al. | |
| 2012/0119951 A1 | 5/2012 | Vollath | |
| 2012/0252453 A1 | 10/2012 | Nagaraja et al. | |
| 2012/0299765 A1 | 11/2012 | Huang et al. | |
| 2012/0329511 A1 | 12/2012 | Keisu | |
| 2013/0041549 A1 | 2/2013 | Reeve et al. | |
| 2013/0203401 A1 | 8/2013 | Ryan et al. | |
| 2013/0215844 A1 | 8/2013 | Seol et al. | |
| 2014/0256376 A1 | 9/2014 | Weissman et al. | |
| 2014/0313080 A1 | 10/2014 | Smith et al. | |
| 2015/0065164 A1 | 3/2015 | Hoseinitabatabaei et al. | |
| 2015/0078191 A1 | 3/2015 | Jongren et al. | |
| 2016/0037550 A1 | 2/2016 | Barabell et al. | |
| 2016/0255667 A1 | 9/2016 | Schwartz | |
| 2016/0262045 A1* | 9/2016 | Yang | H04W 28/0289 |
| 2016/0277087 A1 | 9/2016 | Jo et al. | |
| 2016/0377695 A1 | 12/2016 | Lysejko et al. | |
| 2016/0380353 A1 | 12/2016 | Lysejko et al. | |
| 2016/0380354 A1 | 12/2016 | Bozier et al. | |
| 2016/0380355 A1 | 12/2016 | Lysejko et al. | |
| 2016/0380363 A1 | 12/2016 | Logothetis | |
| 2016/0381570 A1 | 12/2016 | Lysejko et al. | |
| 2016/0381574 A1 | 12/2016 | Dudzinski et al. | |
| 2016/0381590 A1 | 12/2016 | Lysejko et al. | |
| 2016/0381591 A1 | 12/2016 | Lysejko et al. | |
| 2016/0381698 A1* | 12/2016 | Grinshpun | H04L 65/80 370/252 |
| 2017/0111181 A1* | 4/2017 | Zhou | H04L 12/1407 |
| 2017/0280314 A1* | 9/2017 | Yang | H04W 8/12 |

FOREIGN PATENT DOCUMENTS

| | | |
|---|---|---|
| EP | 0654915 A2 | 5/1995 |
| EP | 1903348 A1 | 3/2008 |
| EP | 2113145 A1 | 11/2009 |
| EP | 2207267 A2 | 7/2010 |
| EP | 2391157 A2 | 11/2011 |
| EP | 2448144 A1 | 5/2012 |
| EP | 2506625 A1 | 10/2012 |
| EP | 2538712 A1 | 12/2012 |
| GB | 2318914 A | 5/1998 |
| GB | 2484377 A | 4/2012 |
| JP | H05188128 A | 7/1993 |
| JP | H06188802 A | 7/1994 |
| KR | 101346062 B1 | 12/2013 |
| WO | 9426001 A1 | 11/1994 |
| WO | 199965105 A1 | 12/1999 |
| WO | 0152447 A2 | 7/2001 |
| WO | 0231908 A2 | 4/2002 |
| WO | 03096560 A1 | 11/2003 |
| WO | 2004095764 A2 | 11/2004 |
| WO | 2004114546 A1 | 12/2004 |
| WO | 2005064967 A1 | 7/2005 |
| WO | 2007010274 A1 | 1/2007 |
| WO | 2007069809 A1 | 6/2007 |
| WO | 2008/064696 A1 | 6/2008 |
| WO | 2008111882 A1 | 9/2008 |
| WO | 2008151057 A2 | 12/2008 |
| WO | 2010077790 A1 | 7/2010 |
| WO | 2011044947 A1 | 4/2011 |
| WO | 2011060058 A1 | 5/2011 |
| WO | 2014106539 A1 | 7/2014 |

OTHER PUBLICATIONS

Jung et al., "Attitude Sensing Using a GPS Antenna on a Turntable: Experimental Tests," Navigation, J. of the Institute of Navigation, Fairfax, VA, US, vol. 51, No. 3, Dec. 1, 2004, pp. 221-230.
PCT Search Report from PCT/GB2016/051234 (corresponding to U.S. Appl. No. 15/187,570), dated Aug. 5, 2016, 13 pgs.
PCT Search Report from PCT/GB2016/051360 (corresponding to U.S. Appl. No. 15/187,900), dated Aug. 19, 2016, 12 pgs.
PCT Search Report from PCT/GB2016/051615 (corresponding to U.S. Appl. No. 15/187,515), dated Aug. 12, 2016, 13 pgs.
PCT Search Report from PCT/GB2016/051617 (corresponding to U.S. Appl. No. 15/187,616), dated Aug. 23, 2016, 11 pgs.
PCT Search Report from PCT/GB2016/051618 (corresponding to U.S. Appl. No. 15/187,602), dated Aug. 12, 2016, 12 pgs.
PCT Search Report from PCT/GB2016/051759 (corresponding to U.S. Appl. No. 15/187,680), dated Sep. 14, 2016, 15 pgs.
PCT Search Report from PCT/GB2016/051285, dated Jul. 13, 2016, 12 pgs.
UK Search Report from GB 1519237.0, dated Jun. 10, Apr. 2016, 3 pgs.
UK Search Report from GB 1514938.8, dated Apr. 18, 2016, 4 pgs.
UK Search Report from GB 1516901.4, dated Mar. 18, 2016, 5 pgs.
UK Search Report from GB 1518654.7, dated Mar. 24, 2016, 3 pgs.
UK Search Report from GB 1519216.4, dated Apr. 15, 2016, 5 pgs.
UK Search Report from GB 1519220.6, dated Apr. 4, 2016, 4 pgs.
UK Search Report from GB 1519228.9, dated Apr. 29, 2016, 4 pgs.
UK Search Report from GB 1519270.1, dated Apr. 25, 2016, 5 pgs.
UK Search Report from GB 1519272.7, dated Jun. 10, 2016, 3 pgs.
UK Search Report from GB 1519273.5, dated Apr. 27, 2016, 3 pgs.

(56) References Cited

OTHER PUBLICATIONS

PCT Written Opinion from PCT/GB2016/051195, dated May 17, 2017, 5 pgs.
PCT Written Opinion from PCT/GB2016/051205, dated May 16, 2017, 5 pgs.
PCT Written Opinion from PCT/GB2016/051234, dated May 17, 2017, 10 pgs.
PCT Written Opinion from PCT/GB2016/051285, dated May 10, 2017, 5 pgs.
PCT Written Opinion from PCT/GB2016/051360, dated Jun. 1, 2017, 6 pgs.
PCT Written Opinion from PCT/GB2016/051428, dated Jun. 2, 2017, 12 pgs.
PCT Written Opinion from PCT/GB2016/051615, dated May 17, 2017, 5 pgs.
PCT Written Opinion from PCT/GB2016/051759, dated May 18, 2017, 6 pgs.
PCT Search Report from PCT/GB2016/051195, dated Jul. 25, 2016, 13 pgs.
PCT Search Report from PCT/GB2016/051205, dated Jul. 25, 2016, 13 pgs.
PCT Search Report from PCT/GB2016/051428 (corresponding to U.S. Appl. No. 15/187,188), dated Dec. 13, 2016, 19 pgs.
Office Action in related Case U.S. Appl. No. 15/187,680 dated Nov. 3, 2017, 8 pages.
Office Action in related Case U.S. Appl. No. 15/187,515 dated Dec. 7, 2017, 9 pages.
U.S. Notice of Allowance from U.S. Appl. No. 15/182,209 dated Nov. 22, 2017, 13 pages.
U.S. Notice of Allowance from U.S. Appl. No. 15/187,574 dated Dec. 15, 2017, 14 pages.
U.S. Notice of Allowance from U.S. Appl. No. 15/186,134 dated Mar. 14, 2017, 8 pages.
U.S. Office Action in U.S. Appl. No. 15/182,209 dated Apr. 13, 2017, 17 pages.
Office Action in related Case U.S. Appl. No. 15/186,134 dated Nov. 22, 2016, 18 pages.
Office Action in related Case U.S. Appl. No. 15/187,574 dated May 15, 2018, 13 pages.
U.S. Appl. No. 15/187,602—Office Action dated Feb. 22, 2018, 19 pages.
U.S. Notice of Allowance from U.S. Appl. No. 15/187,515 dated May 4, 2018, 8 pages.
U.S. Notice of Allowance from U.S. Appl. No. 15/187,616 dated Jan. 9, 2018, 12 pages.
U.S. Notice of Allowance from U.S. Appl. No. 15/187,680 dated May 21, 2018, 8 pages.
U.S. Office Action in U.S. Appl. No. 15/187,574 dated Dec. 15, 2017, 14 pages.
U.S. Appl. No. 15/186,900—Non-Final Office Action dated Apr. 11, 2019, 70 pages.

* cited by examiner

| DB ID | UE ID | Type | QCI | Maximum bit rate | Guaranteed bit rate |
|---|---|---|---|---|---|
| 1:1 | UE1 | GBR | 1 | 1 | 1 |
| 1:2 | UE1 | AMBR | 1 | 2 | |
| 1:3 | UE2 | GBR | 1 | 4 | 2 |
| 1:4 | UE3 | GBR | 2 | 8 | 4 |
| 1:5 | UE4 | GBR | 2 | 16 | 8 |
| 1:6 | UE4 | GBR | 7 | 32 | 16 |
| 1:7 | UE4 | AMBR | 1 | 64 | |
| 1:8 | UE4 | AMBR | 4 | 128 | |

Figure 5

QUALITY OF SERVICE IN WIRELESS BACKHAULS

CROSS-REFERENCE TO OTHER APPLICATIONS

This application claims priority under 35 U.S.C. 119(b) to UK Application No. 1511200.6, filed 25 Jun. 2015 and entitled "STEERABLE ANTENNA SYSTEM", and to UK Application No. 1519216.4, filed 30 Oct. 2015 and entitled "QUALITY OF SERVICE IN WIRELESS BACKHAULS". Both applications are incorporated by reference herein.

BACKGROUND

The present technique relates to the field of networking. In particular, the present technique relates to quality of service in a wireless feeder network.

Quality of Service (QoS) relates to particular requirements that are made of a computer network. For example, a live-video application may have a QoS requirement that a bandwidth of 1.5 Mbit/s is provided at a latency of 100 ms. Meeting QoS requirements is dependent on service guarantees, e.g. a guarantee regarding the capacity or bandwidth of a particular connection. For example, a connection between two devices could have a service guarantee of 10 Mbit/s at a latency of 50 ms.\

In a wireless network, it has previously been proposed to provide service guarantees by statically allocating available bandwidth to different devices. For example, if a particular device X has an available bandwidth of 10 Mbit/s and 10 other devices connect to device X, then a bandwidth of 1 Mbit/s could be statically allocated to each device. This can be effective in a wired network where the bandwidth is unlikely to deviate significantly. However, in a wireless network, the bandwidth can vary as a consequence of environmental conditions (e.g. weather) and interference caused by other communications. Accordingly, having allocated, e.g. 1 Mbit/s bandwidth to each device, it could subsequently be the case that for a period of time, an overall bandwidth of only 0.5 Mbit/s is available, meaning that the guaranteed service of 1 Mbit/s cannot even be provided to a single device.

Furthermore, such a policy is wasteful if, for example, some of the devices have nothing to transmit since bandwidth will have been statically allocated to those devices, which then do not make any use of it. In a wired network, this problem can be alleviated by the use of a dynamic allocation schemes. However, such schemes typically rely on, for example, flow control as well as guaranteed available bandwidths, which cannot be provided in a wireless network for the reasons previously given.

Accordingly, it would be desirable to be able to provide service guarantees for devices in a wireless network in order to allow QoS requirements to be met.

Viewed from a first example configuration, there is provided a feeder terminal comprising: backhaul communication circuitry to connect to a communications network via a wireless backhaul, and provide an access base station with access to the wireless backhaul; backhaul information circuitry to determine congestion information relating to the wireless backhaul; and communication circuitry to enable communication with an access base station and provide the congestion information to the access base station, wherein in response to a demand message from the access base station comprising quality of service requirements, the communication circuitry forwards the demand message to the communications network.

Viewed from a second example configuration, there is provided a method of operating a feeder terminal, comprising the steps: connecting to a communications network via a wireless backhaul; providing an access base station with access to the wireless backhaul; determining congestion information relating to the wireless backhaul; providing the congestion information to the access base station, wherein in response to a demand message from the access base station comprising quality of service requirements, the communication circuitry forwards the demand message to the communications network.

Viewed from a third example configuration, there is provided a feeder terminal comprising: backhaul communication means for connecting to a communications network via a wireless backhaul, and for providing an access base station with access to the wireless backhaul; backhaul information means for determining congestion information relating to the wireless backhaul; and communication means for enabling communication with an access base station and for providing the congestion information to the access base station, wherein in response to a demand message from the access base station comprising quality of service requirements, the communication means forwards the demand message to the communications network.

Viewed from a fourth example configuration, there is provided An access base station comprising: communication circuitry to enable communication with a feeder terminal; backhaul communication circuitry to connect to a communications network via a wireless backhaul provided by the feeder terminal, and provide one or more items of user equipment with access to the wireless backhaul; requirement determination circuitry to determine at least one quality of service requirement from the one or more items of user equipment; and access control circuitry to selectively control usage of the wireless backhaul by the one or more items of user equipment, wherein the communication circuitry is to provide a quality of service demand message to the feeder terminal based on the at least one quality of service requirement and to receive congestion information relating to the wireless backhaul from the feeder terminal; and the access control circuitry controls usage of the wireless backhaul by the one or more items of user equipment in dependence on the congestion information.

Viewed from a fifth example configuration, there is provided a method of operating an access base station, comprising the steps: connecting to a communications network via a wireless backhaul provided by a feeder terminal; providing one or more items of user equipment with access to the wireless backhaul; determining at least one quality of service requirement from the one or more items of user equipment; selectively controlling usage of the wireless backhaul by the one or more items of user equipment; providing a quality of service demand message to the feeder terminal based on the at least one quality of service requirement; and receiving congestion information relating to the wireless backhaul from the feeder terminal, wherein usage of the wireless backhaul by the one or more items of user equipment is controlled in dependence on the congestion information.

Viewed from a sixth example configuration, there is provided An access base station comprising: communication means for enabling communication with a feeder terminal; backhaul communication means for connect to a communications network via a wireless backhaul provided by the feeder terminal, and for providing the one or more items of user equipment with access to the wireless backhaul; requirement determination means for determining at least one quality of service requirement from the one or more items of user equipment; and access control means for selectively controlling usage of the wireless backhaul by the one or more items of user equipment, wherein the communication means provides a quality of service demand message to the feeder terminal based on the at least one quality of service requirement and receives congestion information relating to the wireless backhaul from the feeder terminal; and the access control means controls usage of the wireless backhaul by the one or more items of user equipment in dependence on the congestion information.

BRIEF DESCRIPTION OF THE DRAWINGS

The present technique will be described further, by way of example only, with reference to embodiments thereof as illustrated in the accompanying drawings, in which FIG. 1 schematically illustrates an access base station according to one embodiment communicating with a feeder terminal in accordance with one embodiment, in a wireless feeder network.

FIG. 5 shows an example table stored by an access base station, which comprises a number of QoS entries corresponding to services run by items of user equipment;

Figure 1:
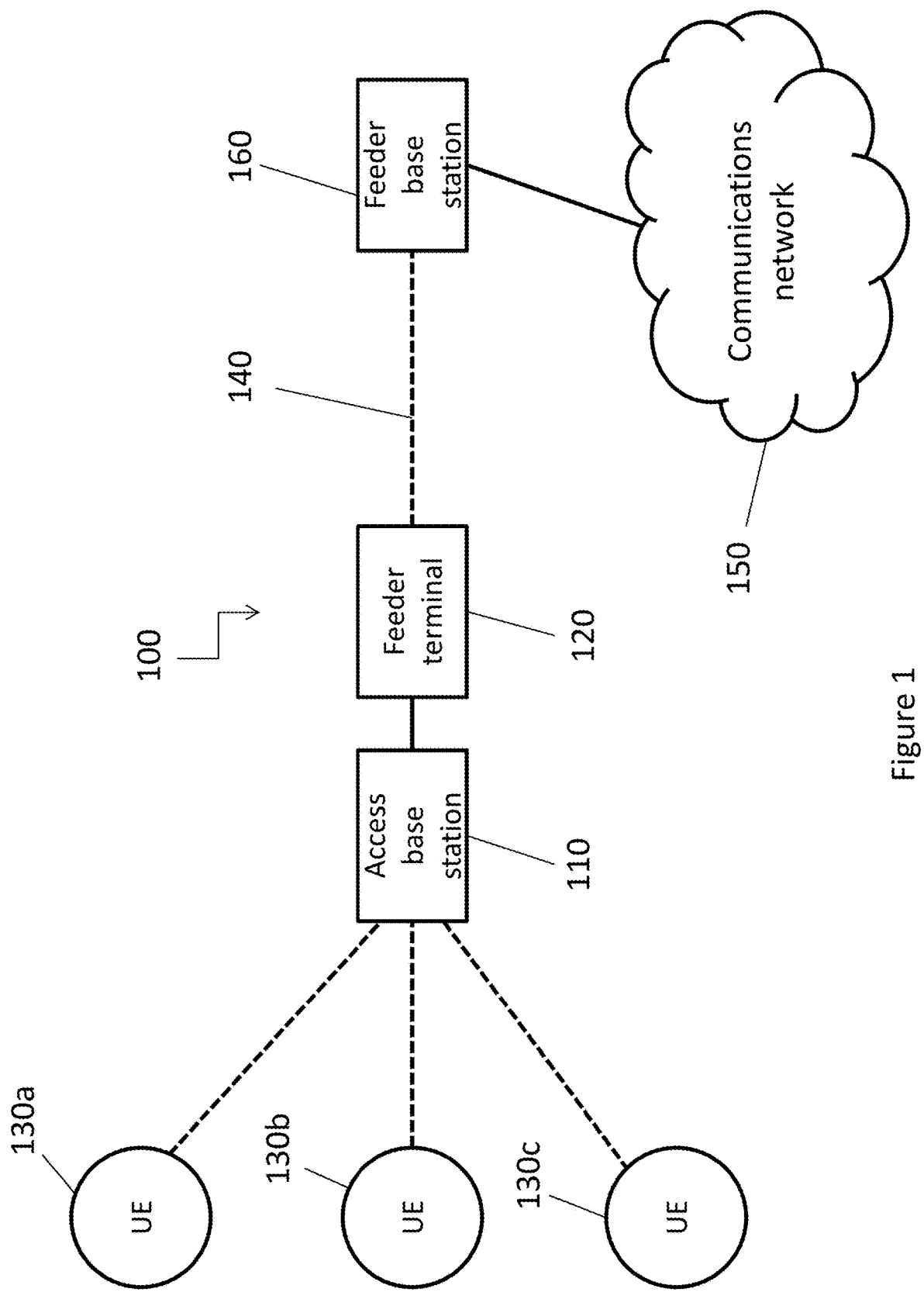

Before discussing the embodiments with reference to the accompanying figures, the following description of embodiments and associated advantages is provided.

In accordance with one example configuration there is provided a feeder terminal comprising: backhaul communication circuitry to connect to a communications network via a wireless backhaul, and provide an access base station with access to the wireless backhaul; backhaul information circuitry to determine congestion information relating to the wireless backhaul; and communication circuitry to enable communication with an access base station and provide the congestion information to the access base station, wherein in response to a demand message from the access base station comprising quality of service requirements, the communication circuitry forwards the demand message to the communications network.

In a wireless feeder network, the wireless feeder terminal receives a wireless backhaul from a feeder base station, which can be directly connected to a communications network. In the example of the LTE (Long Term Evolution) wireless telecommunications Standard, the feeder base station may be referred to as a Donor eNodeB. The feeder terminal provides this wireless backhaul connectivity to, for example, an access base station to which items of user equipment can connect. Accordingly, the items of user equipment are able to make use of the wireless backhaul. The backhaul communication circuitry connects the feeder terminal to a communications network via a wireless backhaul—for example, the feeder terminal can be wirelessly connected to a feeder base station. The backhaul information circuitry determines congestion information relating to the wireless backhaul. The congestion information is data that gives an indication or estimate of the current level of congestion of the wireless backhaul. This information can be used to determine how much of the wireless backhaul's capacity is currently being used. The communication circuitry enables communication with an access base station in order to provide the congestion information to the access base station. Furthermore, in response to a demand message that comprises quality of service requirements from the access base station, the communication circuitry forwards the demand message to the communications network. Note that the communication circuitry and the backhaul communication circuitry can be the same circuitry. In particular, the same circuitry that provides access to the wireless backhaul to the access base station can also enable communication between the access base station and the feeder terminal and also communication between the feeder terminal and the communications network. By determining congestion information regarding the wireless backhaul and passing this information on to the access base station, it is possible for the access base station to alter its behaviour in accordance with the congestion of the wireless backhaul. Similarly, by forwarding demand messages that are generated by the access base station (comprising quality of service requirements), it is possible for the communication network to update or add bearers and/or network policies in order to better meet the quality of service requirements.

In some embodiments, the congestion information relates to an available bandwidth of the wireless backhaul. Bandwidth is a measurement of the rate of data transfer. For example, a bandwidth of 1 MB/second indicates that 1 MB of data can be transferred across the wireless backhaul per second.

In some embodiments, the congestion information relates to a packet drop rate of the wireless backhaul. In networks, where the level of congestion of the network exceeds a particular point, packets of data often end up being dropped. Such a process can be automatic—for example, packets older than a predefined period of time can be considered to be of so little value that they should be dropped. In other cases, packets that are less important could be dropped. In either case, dropping packets can reduce the level of congestion and make it easier for other packets to be sent to their destination.

In some embodiments, the congestion information is based on one or more measurements of the wireless backhaul taken over a predefined period of time. In such cases, the congestion information is based on actual recent or current measurements taken of the wireless backhaul. For example, by trying to push as much data across the wireless backhaul as possible and measuring how much data is actually transmitted in order to gauge a current available bandwidth. In other embodiments, the calculation can be achieved by physically counting the number of dropped packets within a period of time or window. For a wireless backhaul, it is also possible to estimate the available bandwidth based on particular environmental factors. For example, the quality of the signal (such as identified with a Signal to Interference Noise indicator (for example SINR or CINR)) can be used to provide an estimate of the current available bandwidth.

In some embodiments, the congestion information is based on historic data relating to the wireless backhaul. In these embodiments, the backhaul information circuitry uses historic information relating to the wireless backhaul in order to determine the congestion information. For example, the backhaul information circuitry could estimate the congestion information based on how congested the wireless backhaul was at a similar time on a previous day. Alternatively, the backhaul information could perform trend analysis to determine a trend in the congestion level over a recent period of time and use this to perform a projection relating to the current congestion level.

In accordance with another example configuration, there is provided an access base station comprising: communication circuitry to enable communication with a feeder terminal; backhaul communication circuitry to connect to a communications network via a wireless backhaul provided by the feeder terminal, and provide one or more items of user equipment with access to the wireless backhaul; requirement determination circuitry to determine at least one quality of service requirement from the one or more items of user equipment; and access control circuitry to selectively control usage of the wireless backhaul by the one or more items of user equipment, wherein the communication circuitry is to provide a quality of service demand message to the feeder terminal based on the at least one quality of service requirement and to receive congestion information relating to the wireless backhaul from the feeder terminal; and the access control circuitry controls usage of the wireless backhaul by the one or more items of user equipment in dependence on the congestion information.

In a feeder terminal, an access base station acquires access to a wireless backhaul from a feeder terminal. Items of user equipment connect to the access base station and use the wireless backhaul to connect to the communications network. Services provided by the user equipment often require a particular Quality of Service (QoS) to operate effectively. For example, in order for voice to be effectively transmitted over a network, packets must be delivered with a latency under a particular threshold, otherwise the packets will take too long to reach their destination. Furthermore, the backhaul must have a particular capacity, otherwise, it will not be possible to send the encoded voice data to the intended destination quickly enough. In accordance with the above, the communication circuitry enables the access base station to communicate with the feeder terminal whilst the backhaul communication circuitry accesses the wireless backhaul provided by the feeder terminal and provides the items of user equipment with access to the wireless backhaul. The requirement determination circuitry determines at least one quality of service requirement from the one or more items of user equipment. This information can be stored in a database at the access base station, can be determined by querying the items of user equipment, or a combination of the two. Once this has been determined, the communication circuitry is able to form a quality of service demand message, which can be forwarded to the feeder terminal. In addition, the communication circuitry receives congestion information relating to the wireless backhaul from the feeder terminal. The access base station comprises access control circuitry, which is then able to control usage of the wireless backhaul by the one or more items of user equipment in dependence on the congestion information. Consequently, depending on the level of congestion, the access base station is able to adjust the behaviour of the user equipment (and itself) in accordance with the current level of congestion. For example, as congestion increases, the user equipment and the access base station may reduce the transmission of low priority traffic in favour of high priority traffic. Hence, quality of service requirements can be better met. In addition, by providing a quality of service demand message to the communications network, the communications network is able to obtain information relating to the requirements of the user equipment.

In some embodiments, the at least one quality of service requirement comprises one requirement for each class of data received from the one or more items of user equipment. In such cases, rather than reporting the quality of service requirement for each service provided by each item of user equipment separately, the quality of service requirements are provided on a class-by-class basis. Accordingly, less data can be transmitted in the quality of service demand message In some embodiments, the one requirement for each class of data is a bit rate for that class of data. In other words, the requirement is a rate at which bits are to be communicated across the wireless backhaul.

In some embodiments, the bit rate is a maximum required bit rate for that class of data. This represents the maximum required rate at which bits must be transmitted over the wireless backhaul in order for the service to work effectively. As an example, a particular class of data could be such that the most data it will require is 90 bits of data per second.

In some embodiments, the one requirement for each class of data is based on a total maximum required bit rate for that class of data across the one or more items of user equipment. For example, if a particular class of data relates to voice services, of which one has a maximum required bitrate of 50 bits/s and another has a maximum required bitrate of 65 bits/s then this could be represented as the class (voice services) having a total maximum required bit rate of 115 (50+65) bits/s.

In some embodiments, each class of data comprises a QCI and a type; and the type is one of GBR or AMBR. In these embodiments, each class combines a QoS Class Identifier (QCI) with a type (GBR or AMBR). QCI can be considered as an indicator of data priority in a network such as a Long Term Evolution (LTE) network. Each different QCI value is associated with particular QoS requirements such as packet delay/latency and packet error loss. The type can be one of Guaranteed Bit Rate (GBR) or Aggregate Maximum Bit Rate (AMBR). In LTE, GBR applies to a specific connection whereas AMBR is the aggregate maximum bit rate for all bearers that are not of type GBR. In WiMAX, GBR still applies whereas non-GBR connections are termed Best Effort. Accordingly, a class of data could correspond with (QCI=3, type=GBR), and this class of data could have an associated maximum bit rate of 330 Bits/s. This would indicate that for all GBR bearers having a QCI of 3, a total maximum bit rate of 330 Bits/s would be required.

There are a number of ways in which the access control circuitry can control the use of the wireless backhaul by the items of user equipment. However, in some embodiments, each item of user equipment accesses the wireless backhaul utilising resource blocks (also referred to herein as communication slots) allocated to that item of user equipment within a given scheduled period; and the access control circuitry selectively controls usage of the wireless backhaul by an affected item of user equipment by controlling a number of the resource blocks allocated to the affected item of user equipment. For example, if congestion is high, then the number of resource blocks allocated to each item of user equipment in a given scheduling period can be decreased. Accordingly, an item of user equipment could be required to prioritise its data and send only the most important (least delay tolerant) traffic as a consequence of having its number of its available resource blocks cut. Similarly, if congestion is low then the number of resource blocks can be increased, making it more feasible for items of user equipment to send lower priority data.

In some embodiments, the access control circuitry selectively controls usage of the wireless backhaul by an affected item of user equipment by selectively forwarding data provided by the affected item of user equipment to the communications network via the wireless backhaul. The access base station therefore refuses or allows the forwarding of data, depending on the nature of the data in question and the level of the congestion. In such cases, the decision making process regarding which data to send can be made by the access base station itself, which can enable routing decisions to respond to changes in congestion of the wireless backhaul more quickly.

In some embodiments, the quality of service demand message consists of data that has changed since a previous quality of service demand message was provided by the communication circuitry. Accordingly, in these embodiments, there is no need for an entire quality of service demand message to be transmitted each time quality of service requirements are determined from the one or more items of user equipment. Instead, only differences in the requirements are transmitted, thereby reducing the amount of data that must be sent.

In some embodiments, there is provided a network comprising a feeder terminal as previously described connected to an access base station as previously described; and the communications network, wherein in response to receiving the quality of service demand message, the communications network changes the capacity of the wireless backhaul to the feeder terminal in dependence on the at least one quality of service requirement. In these embodiments, the communications network can alter its policies or the way in which data is routed through the network such that the wireless backhaul's capacity is changed. For example, if the at least one quality of service requirements indicate that a greater bandwidth is required then the communications network increases the capacity of the wireless backhaul. This could be achieved, for example, by providing additional connections to feeder base stations at the feeder terminal in order to allow more data to be communicated between the feeder terminal and the feeder base station.

Particular embodiments will now be described with reference to the figures.

FIG. 1 schematically illustrates a wireless feeder network 100 comprising an access base station 110 in accordance with one embodiment, and a feeder terminal 120 in accordance with one embodiment. The access base station 110 is connected to one or more items of user equipment 130a, 130b, 130c. In the example of FIG. 1, the connection is wireless. However, in other embodiments one or more of the connections can be wired. The access base station 110 is also connected to a feeder terminal 120. The feeder terminal 120 provides access to a wireless backhaul 140, which connects the feeder terminal 120 to a communications network 150 via a feeder base station 160. In this embodiment, the access base station 110 and the feeder terminal 120 are shown as separate devices. However, in other embodiments, these devices can be combined into a single device. Access to the wireless backhaul 140 is provided by the feeder terminal 120 to access base station 110, which in turn grants access to the wireless backhaul 140 to the items of user equipment 130. The use of such a feeder network 100 is advantageous as it permits a backhaul to be quickly provided to items of user equipment 130 in an ad-hoc manner without the need for complex or expensive infrastructure to be put in place.

The wireless backhaul 140 is subject to changes in environmental conditions. For example, weather, as well as other nearby radio equipment can affect the quality of the wireless backhaul. This can lead to increased packet loss between the feeder terminal 120 and the feeder base station 160, which in turn can limit the available bandwidth across the wireless backhaul 140. If the items of user equipment 130 provide services that require a particular QoS to operate effectively, then a degradation of the wireless backhaul 140 can cause those services to be negatively affected.

Figure 2:
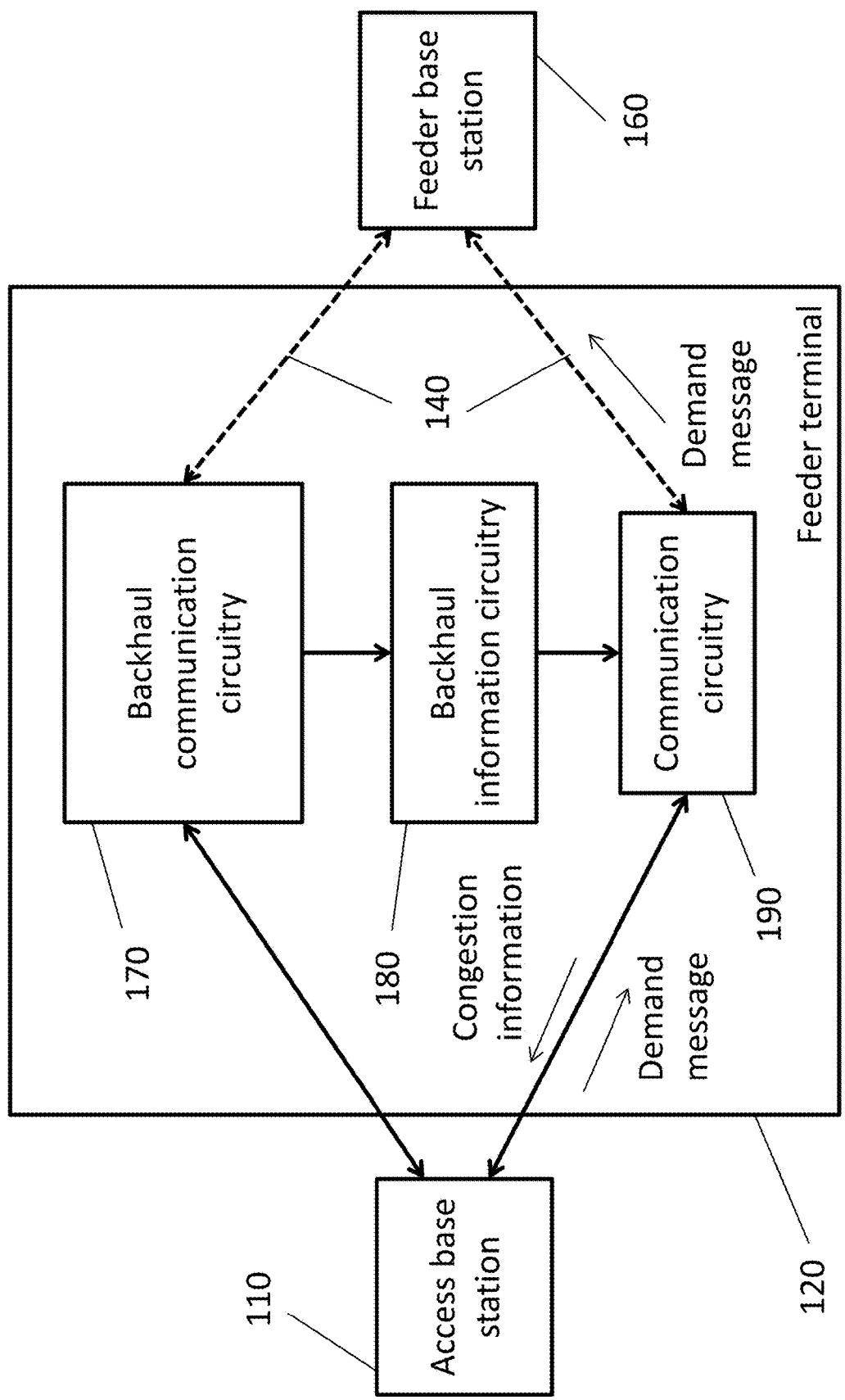
FIG. 2 schematically illustrates a feeder terminal in accordance with one embodiment.

FIG. 2 shows an example of a feeder terminal 120 in accordance with one embodiment. In this embodiment, as previously discussed with reference to FIG. 1, the feeder terminal 120 is wirelessly connected (via wireless backhaul 140) to a feeder base station 160 and also connected to an access base station 110. As shown in FIG. 2, the feeder terminal 120 includes backhaul communication circuitry 170. This provides the access base station 110 with access to the wireless backhaul 140. Backhaul information circuitry 180 is provided to gather congestion information relating to the wireless backhaul 140. In this embodiment, the backhaul information circuitry 180 determines a current bandwidth of the wireless backhaul 140 by monitoring the maximum amount of data transferred using the wireless backhaul 140 for a predefined period of time. This information is provided to the communication circuitry 190 of the feeder terminal 120, which in turn forwards the information to the access base station 110.

In addition, the communication circuitry 190 receives demand messages from the access base station 110. A demand message includes one or more QoS requirements for services provided by user equipment 130. The feeder terminal forwards such demand messages to the communications network 150 via the feeder base station 160 using the wireless backhaul 140. This makes it possible for the communications network 150 to alter its policies and/or the configuration of the network in accordance with changing QoS requirements.

In this embodiment, the backhaul communication circuitry 170 and the communication circuitry 190 are shown as separate circuits.

Figure 3:
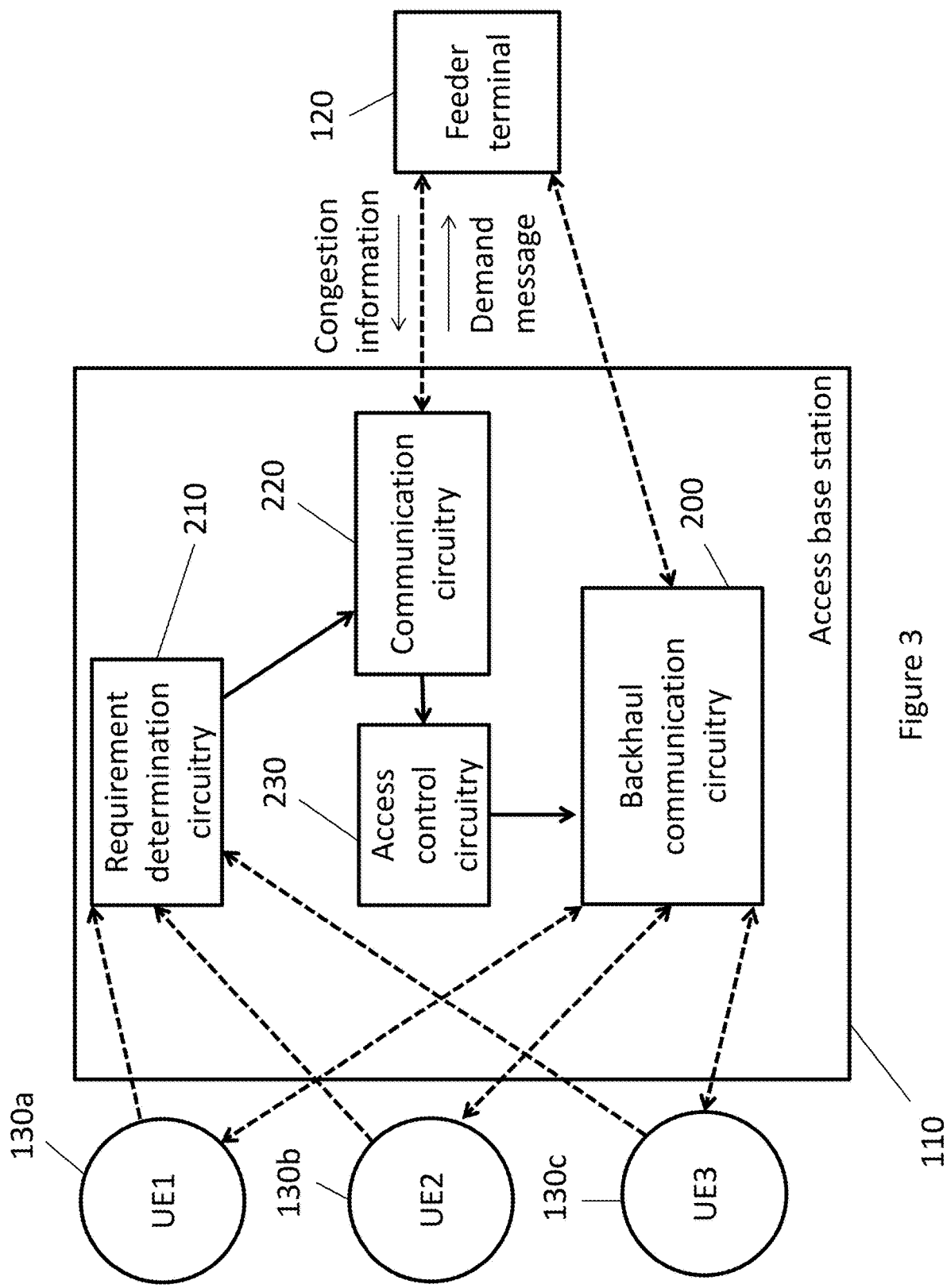
FIG. 3 schematically illustrates an access base station in accordance with one embodiment.

FIG. 3 shows an example of an access base station 110 in accordance with one embodiment. In this embodiment, as previously described with reference to FIG. 1, the access base station 110 is connected to items of user equipment 130a, 130b, 130c as well as to the feeder terminal 120. The access base station 110 includes backhaul communication circuitry 200, which receives access to the wireless backhaul 140 via the feeder terminal 120 and enables the items of user equipment 130 to access the wireless backhaul 140. In addition, requirement determination circuitry 210 determines the different QoS requirements for services run by the user equipment 130. This determination can be made by querying the user equipment 130, by the user equipment 130 announcing to the access base station 110 what QoS requirements it has, by the requirement determination circuitry 210 accessing a local database with such information, or a combination thereof. In any event, once the requirement determination circuitry determines the QoS requirements for the user equipment 130, this is "compressed" by determining the requirements for each class of traffic and forming a demand message. This process is shown in more detail with reference to FIGS. 5 and 6. The demand message is provided to communication circuitry 220, which forwards the message to the feeder terminal 120.

In addition, the communication circuitry 220 receives congestion information from the feeder terminal 120. The congestion information relates to the extent to which the wireless backhaul 140 is congested and in this embodiment, indicates how much bandwidth of the wireless backhaul 140 is available. This information is provided from the communication circuitry 220 to access control circuitry 230, which causes the backhaul communication circuitry 200 to control access to the wireless backhaul 140 in dependence on the congestion information. For example, as the available bandwidth of the wireless backhaul 140 decreases, access to the wireless backhaul by items of user equipment 130 is limited. This access is restored when the available bandwidth of the wireless backhaul 140 increases. In this embodiment, it is up to each item of user equipment how to prioritise the data to send given its more limited access to the wireless backhaul 140. However, in other embodiments, this role can be taken on by the backhaul communication circuitry 200 itself, which refuses to forward particular data (e.g. low priority data) on to the wireless backhaul 140. In other embodiments, the congestion information could take the form of a number of dropped packets or packet loss rate. Typically, as congestion increases (i.e. as current bandwidth approaches the maximum bandwidth) the packet loss rate will increase. A higher packet loss rate or higher number of lost packets can therefore serve as an indication of the current wireless backhaul 140 capacity.

In this embodiment, the backhaul communication circuitry 200 and the communication circuitry 220 are shown as separate circuits. However, in other embodiments, these circuits are the same.

Figure 4:
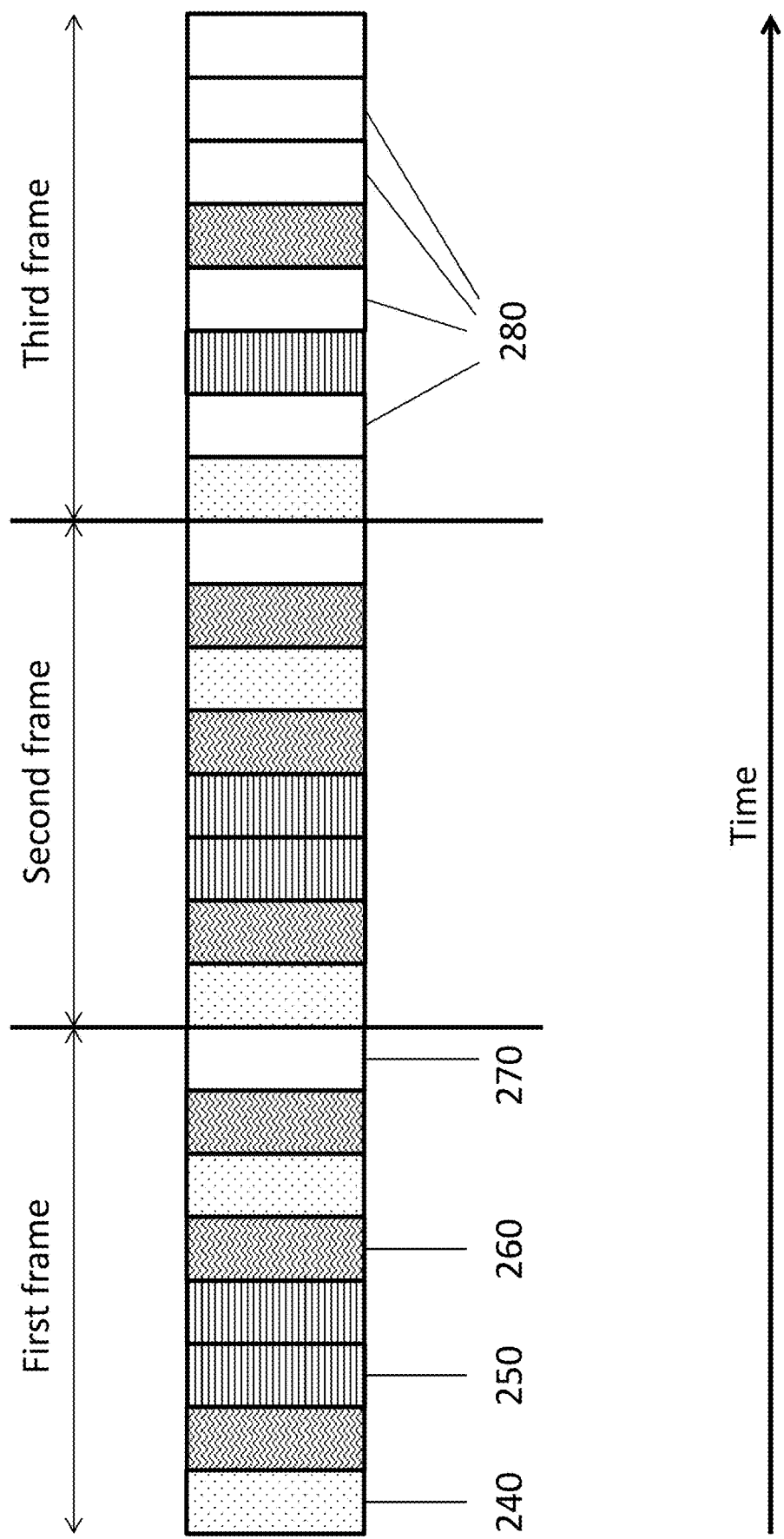
FIG. 4 shows the distribution of a wireless resource by an example feeder terminal among a number of items of user equipment.

FIG. 4 illustrates an example of using wireless resources by the access base station 110 in order to control access to the wireless backhaul 140 by the access control circuitry 230. FIG. 4 illustrates how time can be broken up into different periods or frames. Each such frame comprises a number of resource blocks (also referred to herein as communication slots, or just slots) (8 in this example). For example, a slot might last for 20 ms with each frame therefore lasting 160 ms. Each frame is allocated to a different item of user equipment 130 that connects to the access base station 110. Different forms of shading are shown in FIG. 4 to illustrate the different items of user equipment 130 to which each slot is assigned. For example, a first shading type 240 is provided to indicate slots allocated to UE1 130a. A second shading type 250 is provided to indicate slots allocated to UE2 130b and a third shading type 260 is provided to indicate slots allocated to UE3 130c. Unshaded slots 270 are not allocated to any user equipment and could, for example, be used for the access base station 110 to broadcast data to all items of user equipment 130 at once. An item of user equipment 130 can only transmit using the wireless backhaul 140 via the access base station 110 during a slot that is allocated to that user equipment 130. Consequently, the more slots that an item of user equipment 130 has allocated to it, the more data that item of user equipment 130 can send via the wireless backhaul 140. As shown in FIG. 4, the assignment of slots in the first two frames remains the same. In the third slot, the access control circuitry 230 causes the backhaul communication circuitry 220 to restrict access to the wireless backhaul as a consequence of the congestion information indicating that the wireless backhaul 140 is highly congested (no additional bandwidth available). Accordingly, some slots that were allocated are unallocated, which has the result that the items of user equipment cannot send as much data via the wireless backhaul 140. The user equipment 130 can respond to this by prioritising the data that it transmits. In particular, data that has high QoS demands (e.g. a low latency requirement such as VOIP data) can be transmitted in preference to data that has low QoS demands (e.g. no latency requirements such as downloading web pages). Such a process helps to prevent the congested wireless backhaul 140 from being inundated with data that has low priority, which allows data having high QoS requirements to still be sent—helping those QoS requirements to be met.

FIG. 5 illustrates an example of a database 290 stored by requirement determination circuitry 210 for forming the demand message that is transmitted by the communication circuitry 220 in the access base station 110 to the feeder terminal 120. Each row of the database relates to the QoS requirements for a service that is run by a particular item of user equipment. The columns of the database include a DB ID 300, which is used to uniquely identify each row of the database. A UE ID 310 identifies a particular item of user equipment. A type column 320 indicates the type of QoS requirement that is being made. For example, this might be a Guaranteed Bit Rate (GBR) or an Aggregate Maximum Bit Rate (AMBR). A Quality of Service Class Identifier (QCI) column 330 further defines the QoS requirements for a particular service. In particular, different identifiers place specific requirements on, for example, the permitted latency and packet loss rate for a particular service. Together, the Type 320 and QCI 330 fields define a class of data traffic. A maximum bit rate 340 indicates the maximum required bit rate for the corresponding class of data traffic. Finally, where the traffic type is GBR, a guaranteed bit rate 350 column indicates the maximum bit rate that must be guaranteed for the service to operate. As an example, for a Voice-over-IP (VOIP) service, the guaranteed bit rate column 350 could indicate the bandwidth required for a voice signal to be transmitted at all. In contrast, the maximum bit rate column 340 could indicate the bandwidth required for a voice signal to be transmitted at high quality. Accordingly, for some services, it could be permissible to transmit data about the guaranteed bit rate but below the maximum bit rate, although this may not be ideal. For example, considering the table in FIG. 5, a further item of user equipment UE4 runs 4 services. Firstly, (entry 1:5), GBR traffic of QCI 2 is transmitted having a maximum bit rate requirement of 16 Kbits/s and a guaranteed bit rate requirement of 8 Kbits/s. Secondly (entry 1:6), GBR traffic of QCI 7 is transmitted having a maximum bit rate requirement of 32 Kbits/s and a guaranteed bit rate requirement of 16 Kbits/s. Thirdly (entry 1:7), AMBR traffic of QCI 1 is transmitted having a maximum bit rate requirement of 64 Kbits/s, and fourthly (entry 1:8), AMBR traffic of QCI 4 is transmitted having a maximum bit rate requirement of 128 Kbits/s. Note that in the example of FIG. 5, the maximum bit rate increases at each row by doubling as compared to the last row. This is merely provided for mathematical convenience for the reader in showing how the demand message is calculated.

Figure 6:
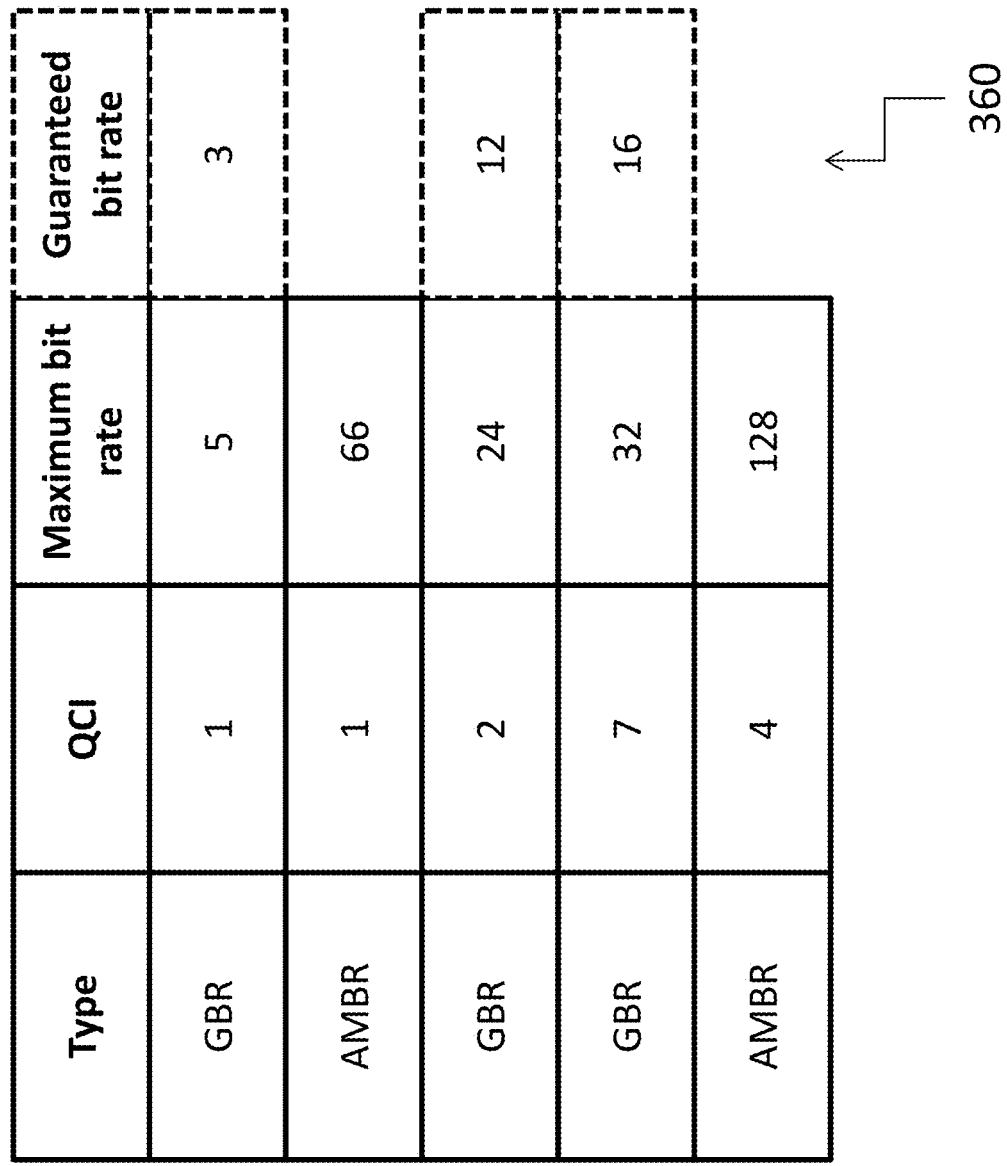
FIG. 6 shows an example in which the QoS entries are amalgamated.

FIG. 6 shows an example of the contents of a demand message as formed from the table shown in FIG. 5. The table of FIG. 5 has been compacted by adding together the maximum bit rate for each service having the same data class. For types of GBR, the guaranteed bit rate is also totalled together. For example, across all the rows in FIG. 5 having a type of GBR and a QCI of 1, the total maximum bit rate is 5 Kbits/s and the total guaranteed bit rate is 3 Kbits/s (entries 1:1 and 1:3). Similarly, across all the rows in FIG. 5 having a type of AMBR and a QCI of 1, the total maximum bit rate is 66 Kbits/s (entries 1:2 and 1:7). Similarly, across all the rows in FIG. 5 having a type of GBR and a QCI of 2, the total maximum bit rate is 24 Kbits/s and the total guaranteed bit rate is 12 Kbits/s (entries 1:4 and 1:5). Across all the rows in FIG. 5 having a type of GBR and a QCI of 7, the total maximum bit rate is 32 Kbits/s and the total guaranteed bit rate is 16 Kbits/s (entry 1:6). Finally, across all the rows in FIG. 5 having a type of AMBR and a QCI of 4, the total maximum bit rate is 128 (entry 1:8). Hence, the table 360 indicates the overall QoS requirements for the access base station 110 to service the user equipment 130. In this embodiment, the overall requirements are determined by calculating a total requirement for each class of data. However, in other embodiments, an average could be calculated instead of a total. Note that if the first four rows of the table shown in FIG. 6 have already been transmitted (for example, if they formed the contents of the previous demand message) but the fifth row has not been transmitted then the fifth row is the only row that would be transmitted as part of the demand message.

Figure 7:
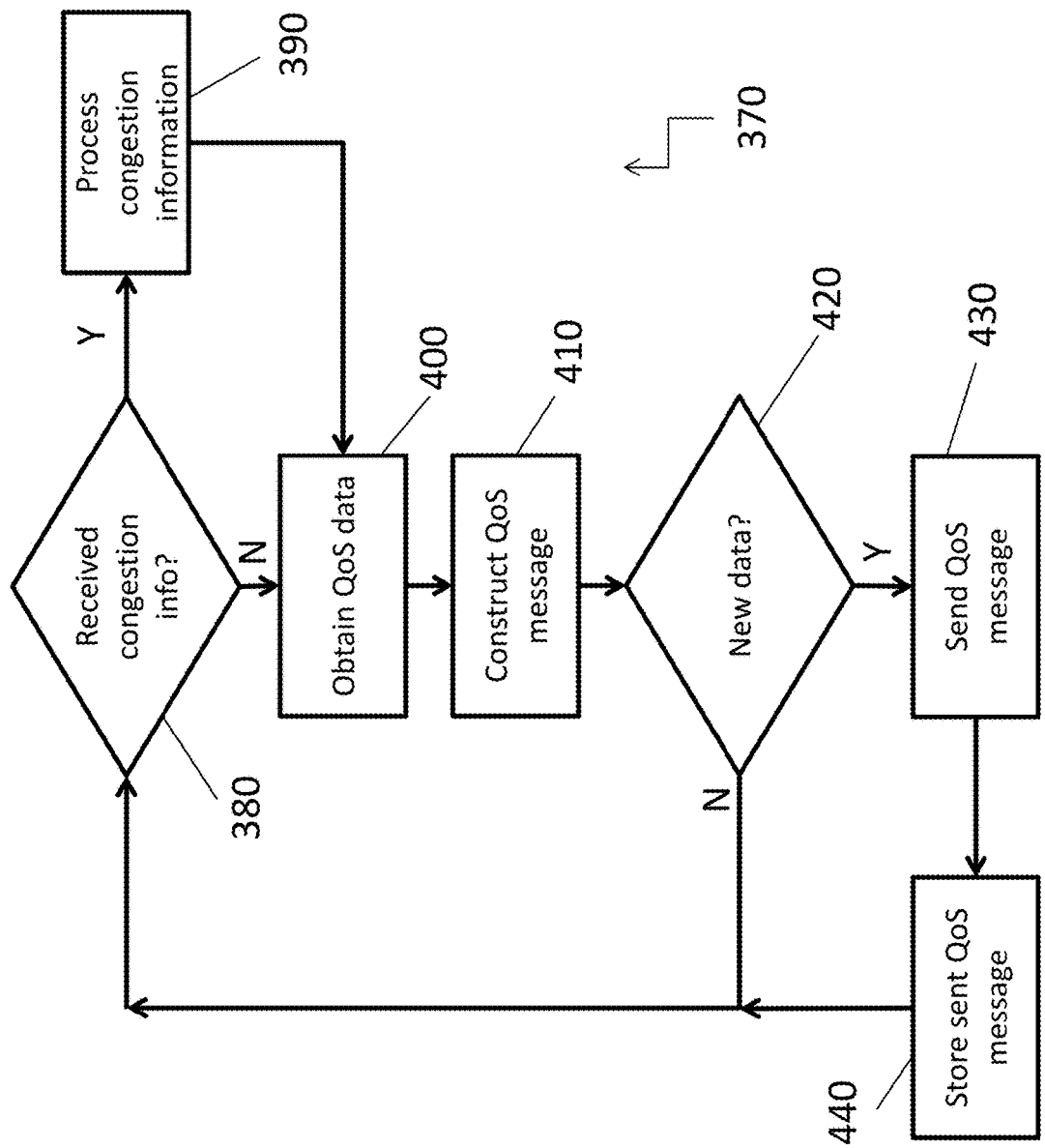
FIG. 7 shows a flow chart that illustrates the behaviour of an access base station in accordance with one embodiment.

FIG. 7 shows a flow chart 370 that illustrates the behaviour of an access base station 110 in accordance with one embodiment. The process starts at step 380 where it is determined whether or not congestion information has been received by the access base station 110. If so, then the congestion information is processed. This could involve the reallocation or deallocation of resources to each item of user equipment as previously explained with reference to FIG. 4. Once this has been done, or if no congestion information has been received, then at step 400, QoS requirements are obtained. This could be carried out by, for example, consulting a database as shown with respect to FIG. 5. The database itself could be populated over time by soliciting (or receiving unsolicited) information from items of user equipment 130 relating to their QoS requirements for services that the user equipment provides. At step 410 a QoS demand message is constructed. At step 420 it is determined whether this new QoS demand message contains information that has not been previously received by the communications network 150. This may be because the QoS requirements have changed or because the previous QoS demand message was not received. In any event, if there is no new data to send, then the process returns to step 380. Alternatively, if there is new data to send, then at step 430 the QoS message is transmitted with the QoS message consisting of the new data. The transmitted message is then locally stored at step 440 so that the access base station 110 can keep track of data that has been transmitted and data that has not been transmitted. Note that in some implementations, the extent to which the QoS demand message must be constructed at step 410 could be significantly reduced. For example, it could be evident from the process of obtaining the QoS data 400 that no new data exists, thereby forgoing step 410 altogether.

Figure 8:
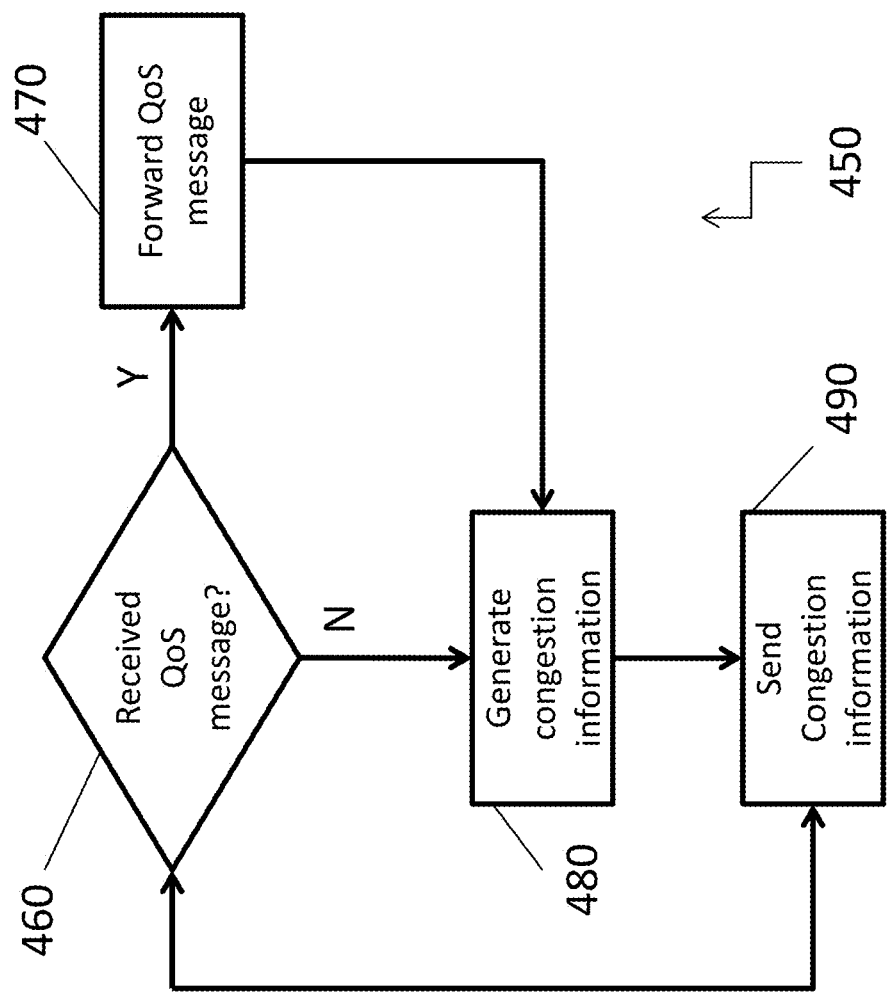
FIG. 8 shows a flow chart that illustrates the behaviour of a feeder terminal in accordance with one embodiment.

FIG. 8 shows a flow chart 450 that illustrates the behaviour of the feeder terminal 120 in accordance with one embodiment. The process starts at step 460 where it is determined whether a QoS demand message has been received. If so, then at step 470, the QoS demand message is forwarded to the communications network 150 via the feeder base station 160. The communications network 150 can respond to this by, for example, updating policies regarding the wireless backhaul or by reallocated resources such that the congestion of the wireless backhaul 140 can be altered. For example, by allocating additional resources to the wireless backhaul 140 it is possible to reduce congestion and thereby meet more of the QoS requirements of the user equipment 130. Once the QoS demand message has been forwarded at step 470 or if no QoS demand message has been received at step 460 then at step 480, the congestion information relating to the wireless backhaul can be determined. This information is then sent to the access base station 110 at step 490 and the process returns to step 460.

Accordingly, it can be seen that feeder terminals 120 and access base stations 110 according to current embodiments can co-operate and exchange information with each other in order to better meet QoS requirements of user equipment 130 in a wireless feeder network.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. A feeder terminal comprising:
    backhaul communication circuitry to connect to a communications network via a wireless backhaul, and provide an access base station with access to the wireless backhaul;
    backhaul information circuitry to determine congestion information relating to the wireless backhaul; and
    communication circuitry to enable communication with an access base station and provide the congestion information to the access base station, wherein
        in response to a demand message from the access base station comprising quality of service requirements, the communication circuitry forwards the demand message to the communications network.

2. A feeder terminal according to claim 1, wherein the congestion information relates to an available bandwidth of the wireless backhaul.

3. A feeder terminal according to claim 1, wherein the congestion information relates to a packet drop rate of the wireless backhaul.

4. A feeder terminal according to claim 1, wherein the congestion information is based on one or more measurements of the wireless backhaul taken over a predefined period of time.

5. A feeder terminal according to claim 1, wherein the congestion information is based on historic data relating to the wireless backhaul.

6. A method of operating a feeder terminal, comprising the steps:
    connecting to a communications network via a wireless backhaul;
    providing an access base station with access to the wireless backhaul;

determining congestion information relating to the wireless backhaul; and providing the congestion information to the access base station, wherein in response to a demand message from the access base station comprising quality of service requirements, communication circuitry forwards the demand message to the communications network.

7. A feeder terminal comprising:
backhaul communication means for connecting to a communications network via a wireless backhaul, and for providing an access base station with access to the wireless backhaul;
backhaul information means for determining congestion information relating to the wireless backhaul; and
communication means for enabling communication with an access base station and for providing the congestion information to the access base station, wherein
in response to a demand message from the access base station comprising quality of service requirements, the communication means forwards the demand message to the communications network.

8. An access base station comprising:
communication circuitry to enable communication with a feeder terminal;
backhaul communication circuitry to connect to a communications network via a wireless backhaul provided by the feeder terminal, and provide one or more items of user equipment with access to the wireless backhaul;
requirement determination circuitry to determine at least one quality of service requirement from the one or more items of user equipment; and
access control circuitry to selectively control usage of the wireless backhaul by the one or more items of user equipment, wherein
the communication circuitry is to provide a quality of service demand message to the feeder terminal based on the at least one quality of service requirement and to receive congestion information relating to the wireless backhaul from the feeder terminal; and
the access control circuitry controls usage of the wireless backhaul by the one or more items of user equipment in dependence on the congestion information.

9. An access base station according to claim 8, wherein
the one or more items of user equipment are adapted to transmit a plurality of classes of data; and
the at least one quality of service requirement comprises one requirement for data in each class of the plurality of classes of data received from the one or more items of user equipment.

10. An access base station according to claim 9, wherein the one requirement for each class of data of the plurality of classes of data is a bit rate for that class of data.

11. An access base station according to claim 10, wherein the bit rate is a maximum required bit rate for that class of data of the plurality of classes of data.

12. An access base station according to claim 11, wherein the one requirement for each class of data of the plurality of classes of data is based on a total maximum required bit rate for that class of data of the plurality of classes of data across the one or more items of user equipment.

13. An access base station according to claim 9, wherein each class of the data comprises a Quality-of-Service Class Identifier and a type; and
the type is one of Guaranteed Bit Rate or Aggregate Maximum Bit Rate.

14. An access base station according to claim 8, wherein each item of user equipment accesses the wireless backhaul utilising resource blocks allocated to that item of user equipment within a given scheduled period; and
the access control circuitry selectively controls usage of the wireless backhaul by an affected item of user equipment by reducing a number of the resource blocks allocated to the affected item of user equipment.

15. An access base station according to claim 8, wherein the access control circuitry selectively controls usage of the wireless backhaul by an affected item of user equipment by selectively forwarding data provided by the affected item of user equipment to the communications network via the wireless backhaul.

16. An access base station according to claim 8, wherein the quality of service demand message consists of data that has changed since a previous quality of service demand message was provided by the communication circuitry.

17. A method of operating an access base station, comprising the steps:
connecting to a communications network via a wireless backhaul provided by a feeder terminal;
providing one or more items of user equipment with access to the wireless backhaul;
determining at least one quality of service requirement from the one or more items of user equipment;
selectively controlling usage of the wireless backhaul by the one or more items of user equipment;
providing a quality of service demand message to the feeder terminal based on the at least one quality of service requirement; and
receiving congestion information relating to the wireless backhaul from the feeder terminal, wherein
usage of the wireless backhaul by the one or more items of user equipment is controlled in dependence on the congestion information.

18. An access base station comprising:
communication means for enabling communication with a feeder terminal;
backhaul communication means for connecting to a communications network via a wireless backhaul provided by the feeder terminal, and for providing one or more items of user equipment with access to the wireless backhaul;
requirement determination means for determining at least one quality of service requirement from the one or more items of user equipment; and
access control means for selectively controlling usage of the wireless backhaul by the one or more items of user equipment, wherein
the communication means provides a quality of service demand message to the feeder terminal based on the at least one quality of service requirement and receives congestion information relating to the wireless backhaul from the feeder terminal; and
the access control means controls usage of the wireless backhaul by the one or more items of user equipment in dependence on the congestion information.

19. A network comprising:
a communications network;
a feeder terminal comprising:
backhaul communication circuitry to connect to the communications network via a wireless backhaul, and provide an access base station with access to the wireless backhaul;

backhaul information circuitry to determine congestion information relating to the wireless backhaul; and
communication circuitry to enable communication with an access base station and provide the congestion information to the access base station, wherein
in response to a quality of service demand message from the access base station comprising quality of service requirements, the communication circuitry forwards the quality of service demand message to the communications network; and the access base station comprising:
further communication circuitry to enable communication with the feeder terminal;
further backhaul communication circuitry to connect to the communications network via the wireless backhaul provided by the feeder terminal, and provide one or more items of user equipment with access to the wireless backhaul;
requirement determination circuitry to determine at least one quality of service requirement from the one or more items of user equipment; and
access control circuitry to selectively control usage of the wireless backhaul by the one or more items of user equipment, wherein the further communication circuitry is to provide the quality of service demand message to the feeder terminal based on the at least one quality of service requirement and to receive the congestion information relating to the wireless backhaul from the feeder terminal, and the access control circuitry controls usage of the wireless backhaul by the one or more items of user equipment in dependence on the congestion information;

wherein the feeder terminal is connected to the access base station; and wherein, in response to receiving the quality of service demand message, the communications network changes a capacity of the wireless backhaul to the feeder terminal in dependence on the at least one quality of service requirement.

20. The feeder terminal according to claim 1, wherein the congestion information provides an indication of a current level of congestion of the wireless backhaul.

* * * * *